US010645797B2

(12) United States Patent
Han et al.

(10) Patent No.: US 10,645,797 B2
(45) Date of Patent: May 5, 2020

(54) ELECTROMAGNETIC INTERFERENCE (EMI) SHIELD FOR A PRINTED CIRCUIT BOARD (PCB)

(71) Applicant: Intel Corporation, Santa Clara, CA (US)

(72) Inventors: Dong-Ho Han, Beaverton, OR (US); Timothy Swettlen, Portland, OR (US)

(73) Assignee: Intel Corporation, Santa Clara, CA (US)

(*) Notice: Subject to any disclaimer, the term of this patent is extended or adjusted under 35 U.S.C. 154(b) by 139 days.

(21) Appl. No.: 15/660,481

(22) Filed: Jul. 26, 2017

(65) Prior Publication Data

US 2019/0037683 A1    Jan. 31, 2019

(51) Int. Cl.
*H05K 9/00* (2006.01)
*H05K 1/02* (2006.01)
*H05K 1/18* (2006.01)
*G06F 1/16* (2006.01)

(52) U.S. Cl.
CPC ......... *H05K 1/0216* (2013.01); *G06F 1/1633* (2013.01); *H05K 1/182* (2013.01); *H05K 9/0081* (2013.01)

(58) Field of Classification Search
None
See application file for complete search history.

(56) References Cited

U.S. PATENT DOCUMENTS

| 6,686,649 | B1* | 2/2004 | Mathews | H01L 23/552 257/659 |
| 6,940,013 | B2* | 9/2005 | Vinciarelli | H01R 12/57 174/541 |
| 8,792,246 | B2* | 7/2014 | Kratzer | H05K 9/0028 174/354 |
| 8,890,628 | B2 | 11/2014 | Nair et al. | |
| 9,521,741 | B1* | 12/2016 | Wang | H05K 1/0216 |
| 9,673,179 | B1* | 6/2017 | Huber | H01L 25/0657 |
| 9,706,661 | B2* | 7/2017 | Choi | H01L 23/13 |
| 2002/0030264 | A1 | 3/2002 | Shimada et al. | |
| 2003/0213619 | A1* | 11/2003 | Denzene | H05K 1/0243 174/261 |
| 2004/0100778 | A1* | 5/2004 | Vinciarelli | H05K 1/141 361/760 |
| 2007/0069375 | A1* | 3/2007 | Sugimoto | H01L 23/5389 257/723 |

(Continued)

OTHER PUBLICATIONS

T. Clupper and J. Rowan (2003). PCB level Shielding for Portable Wireless Devices. Wireless Systems Design Conference and Expo, 2nd Revision. San Jose, CA, 23 pages.

*Primary Examiner* — Xanthia C Cunningham
(74) *Attorney, Agent, or Firm* — Schwabe, Williamson & Wyatt, P.C.

(57) ABSTRACT

Embodiments herein disclose techniques for electronic apparatuses including a printed circuit board (PCB) and an electromagnetic interference (EMI) shield for the PCB. An electronic apparatus may include a PCB with a plurality of layers including a ground layer. The PCB may include a cutout through the plurality of layers of the PCB. An EMI shield may be mounted to a bottom side of the PCB along an edge of the cutout, where the EMI shield may be coupled to the ground layer through an ohmic contact. The EMI shield may be flat. Other embodiments may also be described and claimed.

25 Claims, 8 Drawing Sheets

(56) References Cited

U.S. PATENT DOCUMENTS

| | | | |
|---|---|---|---|
| 2007/0127725 A1 | 6/2007 | Tominaga et al. | |
| 2008/0029476 A1* | 2/2008 | Ohmi | H05K 1/0216 216/13 |
| 2008/0111217 A1* | 5/2008 | Dimaano | H01L 23/4334 257/675 |
| 2008/0179717 A1* | 7/2008 | Wu | H01L 23/552 257/659 |
| 2011/0293128 A1* | 12/2011 | Kuratani | B81B 7/0064 381/361 |
| 2013/0127025 A1* | 5/2013 | Cho | H01L 23/552 257/660 |
| 2013/0271924 A1* | 10/2013 | Shen | H05K 1/181 361/728 |
| 2013/0319731 A1* | 12/2013 | Lee | H05K 1/0216 174/251 |
| 2015/0034364 A1* | 2/2015 | Ho | H05K 1/0215 174/251 |
| 2015/0264844 A1* | 9/2015 | Jang | H05K 1/023 361/784 |
| 2015/0271911 A1* | 9/2015 | Chen | H05K 1/0216 361/760 |
| 2015/0282298 A1* | 10/2015 | Atkinson | H05K 1/0218 174/377 |

\* cited by examiner

ELECTROMAGNETIC INTERFERENCE (EMI) SHIELD FOR A PRINTED CIRCUIT BOARD (PCB)

TECHNICAL FIELD

The present disclosure relates to the field of electronic circuits. More particularly, the present disclosure relates to an electromagnetic interference (EMI) shield for a printed circuit board (PCB) having particular application to client and edge devices.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A circuit package, such as those used in client and edge devices, may be used to protect electronic components within the circuit package from damage. Electronic components, e.g., integrated circuit (IC) chips or dies, may be placed into a circuit package to allow easy handling and assembly onto a printed circuit board (PCB) to form an electronic system, an electronic apparatus, or a computing device. IC components may be placed within a circuit package in various locations. For example, a processor or a voltage regulator (VR) may be located on one side of a package substrate, while a land side capacitor (LSC) may be located on another side of the package substrate. Since a LSC may be taller than ball grid array (BGA) solder balls coupling the circuit package to the PCB, a cutout may be formed on the PCB to accommodate the LSCs while reducing the overall height of an electronic apparatus including the circuit package on the PCB. However, the cutout may cause other problems for the electronic apparatus. For example, an inductor in a VR within a circuit package may induce switching noises leaking through the cutout of the PCB. Solutions may be desired to reduce the switching noise leakage through the cutout of the PCB, while reducing the height of the electronic apparatus including the circuit package on the PCB.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
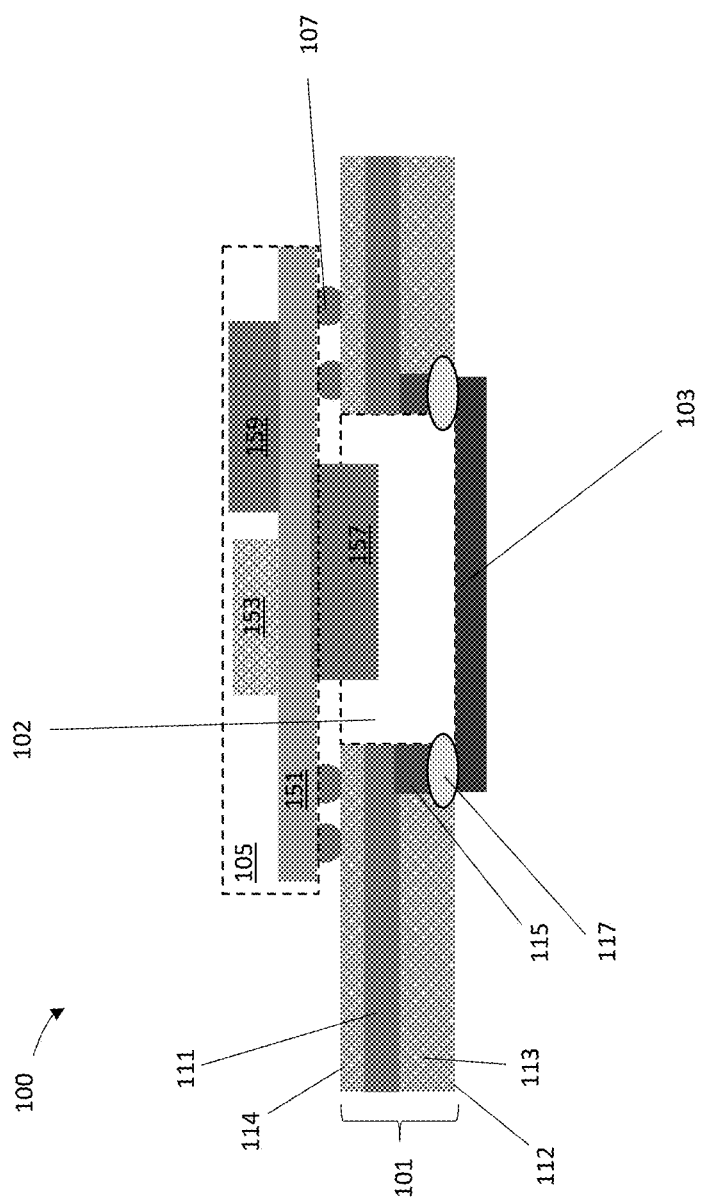
FIG. 1 illustrates a cross-section view of an example electronic apparatus including a printed circuit board (PCB) having a cutout, and an electromagnetic interference (EMI) shield mounted to a bottom side of the PCB along an edge of the cutout, according to various embodiments.

Embodiments of the present disclosure include techniques and configurations for electronic apparatuses and methods for making electronic apparatuses including a printed circuit board (PCB) and an electromagnetic interference (EMI) shield for the PCB. In some embodiments, a PCB may include a cutout to accommodate components, e.g., a land side capacitor (LSC), of a circuit package affixed to the PCB. However, a component, e.g., an inductor in a voltage regulator (VR), contained within the circuit package may induce switching noise leakage through the cutout of the PCB. To block switching noise leakage, an EMI shield may be used. A typical on-board EMI shield may be a three dimensional box with a height in a range of about 800 um to 1000 um. Such a large height of a three dimensional EMI shield box may not be feasible for client or edge devices, such as a wearable device, a smartphone, a gateway, or an Internet of Things (IOT) device. Other alternative design may include a recessed cavity on the PCB, instead of a cutout through all layers of the PCB, to block the switching noise leakage while reducing the height of the electronic apparatus including the circuit package on the PCB. However, a PCB with a recessed cavity may be more expensive to manufacture than the normal PCB, and may only be applicable to some specific applications.

In some embodiments, an electronic apparatus may include a PCB having a cutout and an EMI shield for the PCB. The EMI shield may be mounted to a bottom side of the PCB along an edge of the cutout of the PCB. The EMI shield may be flat, instead of a three dimensional box, to reduce the height of the electronic apparatus. The EMI shield may be coupled to a ground layer of the PCB through an ohmic contact located at a corner around the cutout. The EMI shield may be flush mounted or surface mounted to the bottom side of the PCB to reduce the height of the electronic apparatus. The use of a flat EMI shield may bring down the cost in comparison to a conventional EMI shield, which may be a three dimensional box.

In some embodiments, an electronic apparatus may include a PCB with a plurality of layers including a ground layer. The PCB may include a cutout through the plurality of layers of the PCB. An EMI shield may be mounted to a bottom side of the PCB along an edge of the cutout, where the EMI shield may be coupled to the ground layer through an ohmic contact. In some embodiments, the EMI shield may be flat.

In some embodiments, an electronic apparatus may include a PCB with a plurality of layers including a ground layer. A circuit package may be affixed to the PCB on a top side of the PCB. The PCB may include a cutout through the plurality of layers of the PCB, while a part of a component of the circuit package may be placed within the cutout of the PCB. An EMI shield may be mounted to a bottom side of the PCB along an edge of the cutout, where the EMI shield may be coupled to the ground layer through an ohmic contact. In some embodiments, the EMI shield may be flat.

In some embodiments, a computing device may include a circuit package having a processor, a display coupled to the processor, and a PCB. The circuit package may be affixed to the PCB on a top side of the PCB. The PCB may have a plurality of layers including a ground layer, and the PCB may include a cutout through the plurality of layers. An EMI shield may be mounted to a bottom side of the PCB along an edge of the cutout. The EMI shield may be coupled to the ground layer through an ohmic contact. In some embodiments, the EMI shield may be flat.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a programmable combinational logic circuit (such as a Field Programmable Gate Array (FPA)), a hardware accelerator, a processor (shared, dedicated, or group) and/or memory (shared, dedicated, or group) that execute one or more software or firmware programs, and/or other suitable components that provide the described functionality.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes.

As used herein, the term "interface circuitry" may refer to, is part of, or includes circuitry providing for the exchange of information between two or more components or devices. The term "interface circuitry" may refer to one or more hardware interfaces (for example, buses, input/output (I/O) interfaces, peripheral component interfaces, network interface cards, and/or the like).

As used herein, the term "computer device" or "computing device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management System (EEMS), electronic/engine control units (ECUs), electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

FIG. 1 illustrates a cross-section view of an example electronic apparatus 100 including a PCB 101 having a cutout 102, and an electromagnetic interference (EMI) shield 103 mounted to a bottom side 112 of the PCB 101 along an edge of the cutout 102, according to various embodiments. For clarity, features of a PCB, e.g., the PCB 101, a circuit package, e.g., a circuit package 105, or an EMI shield, e.g., the EMI shield 103, may be described below as examples for understanding an example PCB, an example circuit package, and/or an example EMI shield. It is to be understood that there may be more or fewer components within a PCB, a circuit package, and/or an EMI shield. Further, it is to be understood that one or more of the components within the PCB, the circuit package, and/or the EMI shield may include additional and/or varying features from the description below, and may include any device that one having ordinary skill in the art would consider and/or refer to as a PCB, a circuit package, and/or an EMI shield.

In embodiments, the electronic apparatus 100 may include the PCB 101 with a top side 114 and the bottom side 112 opposite to the top side 114. The PCB 101 may include multiple layers, e.g., a ground layer 111, a dielectric layer 113, and other conductive layers and dielectric layers. The PCB 101 may include the cutout 102 that is through the multiple layers of the PCB 101. The EMI shield 103 may be mounted to the bottom side 112 of the PCB 101 along an edge of the cutout 102. The EMI shield 103 may be coupled to the ground layer 111 through a via 115 and an ohmic contact 117. In some embodiments, the EMI shield may be flat.

In addition, the circuit package 105 may be affixed to the PCB 101 on the top side 114 of the PCB 101 through connectors 107. A part of a component 157 of the circuit package 105 may be placed within the cutout 102 of the PCB 101. In addition, the circuit package 105 may include a package substrate 151. The component 157, a component 153, and a component 159 may be placed on different sides of the package substrate 151. In some embodiments, the component 157 may be a LSC, while the component 153 may be a voltage regulator (VR). In embodiments, a VR may be referred to as an integrated voltage regulator (IVR). The circuit package 105 may further include the component 159, e.g., a processor. The component 153, e.g., a VR, and the component 159, e.g., a processor, may be a part of a system-on-chip (SoC).

In embodiments, the electronic apparatus 100 may be any one of a number of mobile and/or non-mobile client or edge devices. A mobile client device may include, but is not to be limited to, for example, a laptop computer, an ultra-laptop computer, a tablet, a touch pad, a portable computer, a handheld computer, a wearable device, a palmtop computer, a personal digital assistant (PDA), an e-reader, a cellular telephone, a combination cellular telephone/PDA, a mobile smart device (e.g., a smart phone, a smart tablet, etc.), a mobile internet device (MID), a mobile messaging device, a mobile data communication device, a mobile media playing device, a camera, a mobile gaming console, etc. A non-mobile client or edge devices may include, but is not to be limited to, for example, a personal computer (PC), a television, a smart television, a data communication device, a media playing device, a gaming console, a gateway, an Internet of Things (IOT) device, etc. The electronic apparatus 100 may include controllers (or processors) and other components that execute software and/or control hardware to execute local programs or consume services provided by external service providers over a network. For example, the electronic apparatus 100 may include one or more software clients or applications that run locally and/or utilize or access web-based services (e.g., online stores or services, social networking services, etc.). The electronic apparatus 100 may also, or instead, include a web interface running in a browser from which the electronic apparatus can access such web-based services. The electronic apparatus 100 may also include storage devices to store logic and data associated with the programs and services used by the electronic apparatus 100.

In embodiments, the PCB 101 may mechanically support and electrically connect electronic components, e.g., the circuit package 105, using conductive tracks, pads and other features etched from copper sheets or other metal sheets laminated onto a non-conductive substrate. In embodiments, the PCB 101 may be a motherboard with expansion capability so that various components or packages may be attached to the PCB. For example, circuit packages attached to the PCB 101 may include peripherals, interface cards, TV tuner cards, or cards providing extra USB or FireWire slots. The PCB 101 may also include daughter cards attached to the PCB 101, where the daughter cards may include sound cards, video cards, network cards, hard drives, or other forms of persistent storage, or a variety of other custom components or packages. In some embodiments, the PCB 101 may be a mainboard, which may be a single board with limited or no additional expansion capability, such as controlling boards in laser printers, televisions, washing machines, or other embedded systems with limited expansion abilities.

In embodiments, the PCB 101 may be a single sided board with one metal layer, a double sided board with two metal layers, or a multi-layer board with outer and inner layers. In embodiments, the PCB 101 may be a multi-layer board including a plurality of layers, such as the ground layer 111, the dielectric layer 113, and other layers. The plurality of layers may include a metal layer, a power layer, or a signal layer, in addition to the ground layer 111. Conductors on different layers of the PCB 101 may be connected with vias, e.g., the via 115.

In embodiments, the dielectric layer 113 may be a woven glass reinforced layer, or a non-woven glass reinforced layer. The dielectric layer 113 may include a material that may be a poor conductor of electricity, such as porcelain, mica, glass, plastics and some metal oxides. In embodiments, the ground layer 111 may include a conductive metal or an alloy of metal, such as aluminum, copper, and/or steel alloy, or other conductive metal.

In embodiments, the PCB 101 may have the cutout 102. The cutout 102 may extend through the plurality of layers of the PCB 101. For example, the cutout 102 may extend through the ground layer 111, the dielectric layer 113, and any other layers. In some other embodiments, the cutout 102 may cut through a number of layers, but may leave some other layers intact, without cutting through all the layers of the PCB 101. The cutout 102 may be of a circular shape, a square, a rectangular shape, an elliptical shape, or a polygon shape.

In embodiments, a circuit package, e.g., the circuit package 105, may be affixed to the PCB 101 on the top side 114 of the PCB 101 by one or more connectors 107. In embodiments, the circuit package 105 may be a chip scale package (CSP), a wafer-level package (WLP), a multi-chip package (MCP), a quad-flat no-leads (QFN) package, a dual-flat no-leads (DFN) package, a flip chip package, or a ball grid array (BGA) package. A CSP may be a flip chip device including solder balls or bumps that are approximately 250 um tall. A wafer-level package may be a circuit package at a wafer level, instead of individual dies obtained from dicing them from a wafer. Both QFN and DFN packages may refer to packages that connect ICs to the surfaces of PCBs without through-holes.

In embodiments, the circuit package 105 may include the package substrate 151. In embodiments, the package substrate 151 may be a polymeric substrate, a non-polymeric substrate, a silicon substrate, a silicon on insulator (SOI) substrate, or a silicon on sapphire (SOS) substrate, among various other substrate materials. The component 157, the component 153, and the component 159 of the circuit package 105 may be placed on different sides of the package substrate 151. A part of the component 157 of the circuit package 105 may be placed within the cutout 102 of the PCB 101. In some embodiments, the component 157 may be a LSC, the component 153 may be a VR or an IVR, while the component 159 may be a processor. In some embodiments, instead of being a LSC, the component 157 may be any component with a height that may be higher than the connectors 107. Similarly, the component 153 and the component 159 may be any components other than a VR and/or a processor. Other components, such as active devices, or passive devices such as capacitors, resistors, may be included in the circuit package 105, not shown. Additionally and alternatively, fewer components may be included in the circuit package 105, without the component 153, the component 159, or both.

The circuit package 105 may be coupled to the PCB 101 by the connectors 107. One or more such connectors 107 may be used to make the connection between the circuit package 105 and the PCB 101. In embodiments, the connectors 107 may be a stud, a wire-bonding wire, a bump, a ball, a solder pillar, or others. For example, the connector 107 may include one or more solder balls, where the solder balls may include solder alloy such as tin-lead (Sn—Pb) solders or lead free solders such as tin/silver/copper or some other lead-free solder. In addition, the circuit package 105 may include more materials or components not shown. For example, the circuit package 105 may include an underfill layer between the component 157 and the substrate 151, or between the component 153 and the substrate 151.

Figure 3:
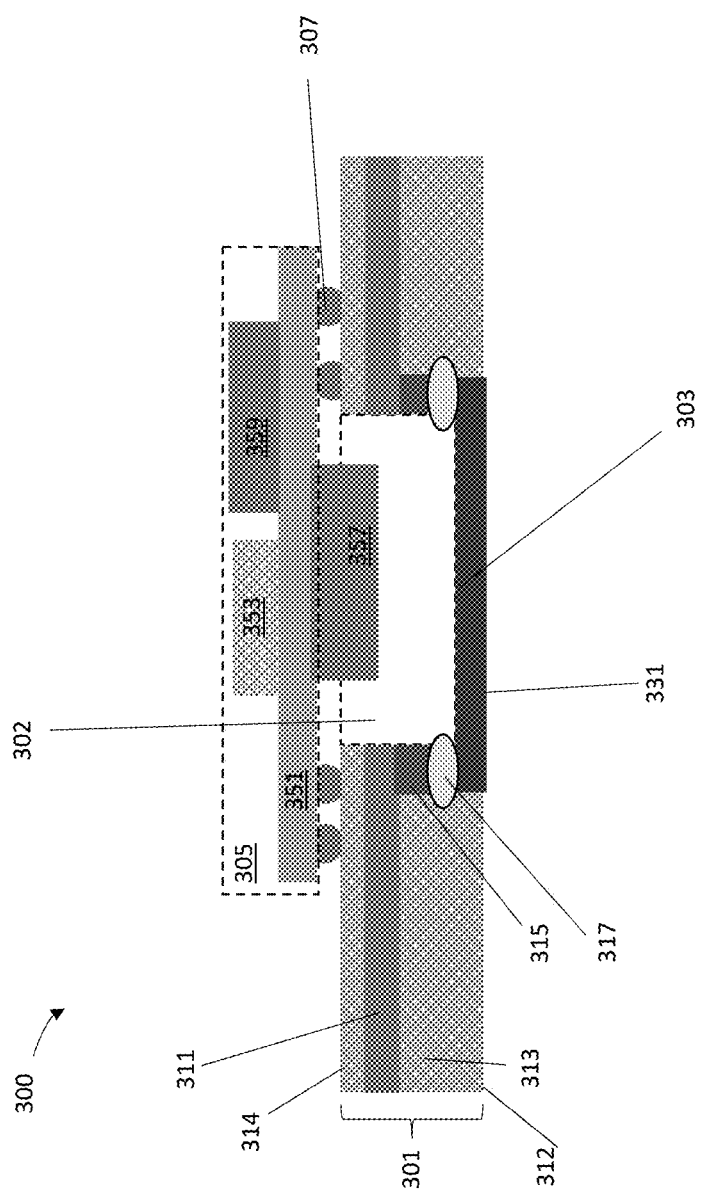
FIG. 3 illustrates a cross-section view of another example electronic apparatus including a PCB having a cutout, and an EMI shield mounted to a bottom side of the PCB along an edge of the cutout, according to various embodiments.

In some embodiments, the EMI shield 103 may be mounted to the bottom side 112 of the PCB 101 along an edge of the cutout 102. The EMI shield 103 may block switching noise leakage of the circuit package 105. The EMI shield 103 may be flat, and may be surface mounted to the bottom side 112 of the PCB 101, as shown in FIG. 1. In some other embodiments, the EMI shield 103 may be flush mounted to the bottom side 112 of the PCB 101, as shown in FIG. 3. In some embodiments, the EMI shield 103 may have a thickness of about 80 um-100 um, which may be much smaller than other typical EMI shield of a thickness about 800 um to 1000 um. The EMI shield 103 may be coupled to the ground layer 111 through the ohmic contact 117 by way of the via 115. In embodiments, the ohmic contact 117 may be located at a corner around the cutout 102, and the ohmic contact 117 may be formed by a conductive paste or epoxy. The EMI shield 103 may include copper, aluminum, copper alloy, nickel, silver, or an EMI shielding plastic compound material. In embodiments, there may not be any solder mask layer between the ohmic contact 117 and the ground layer 111.

Figure 2:
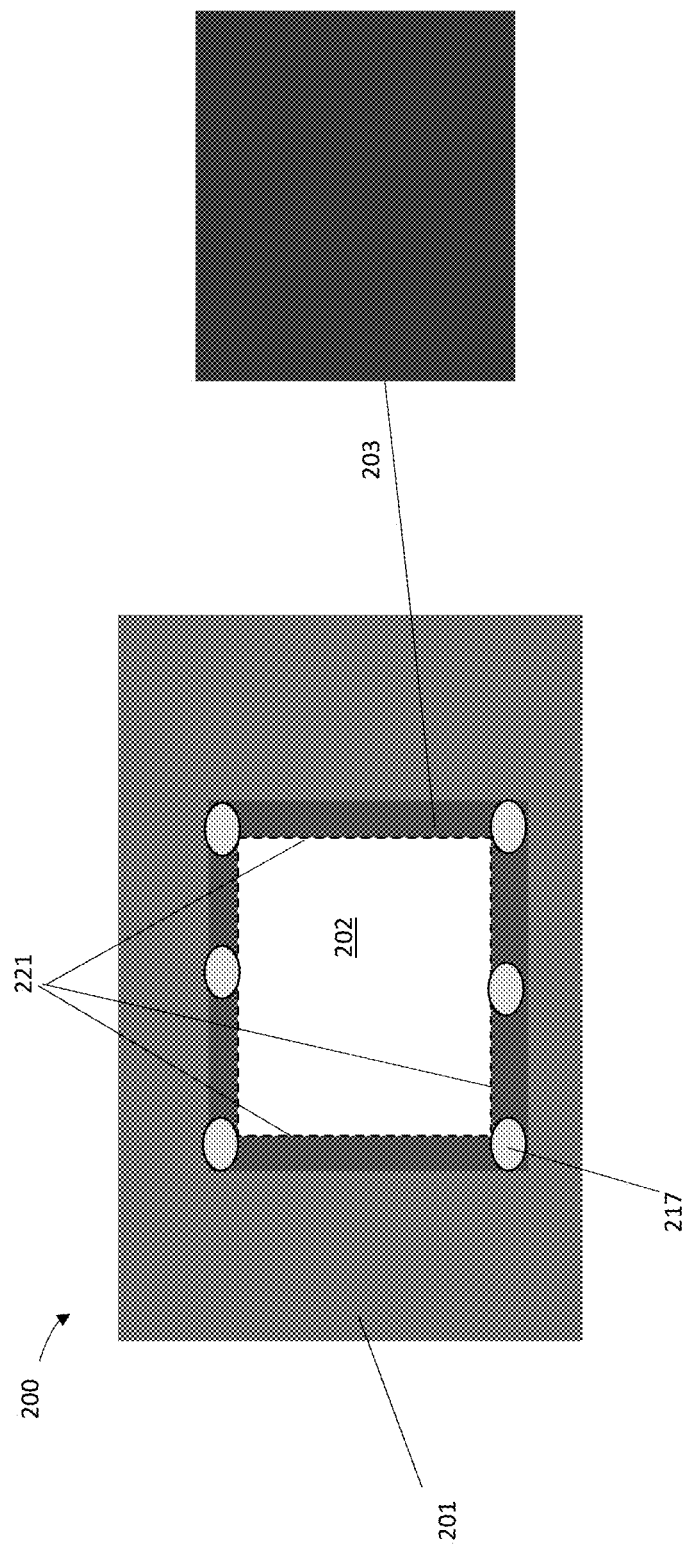
FIG. 2 illustrates a top view of an example electronic apparatus including a PCB having a cutout, and an EMI shield mounted to a bottom side of the PCB along an edge of the cutout, according to various embodiments.

FIG. 2 illustrates a top view of an example electronic apparatus 200 including a PCB 201 having a cutout 202, and an EMI shield 203 mounted to a bottom side of the PCB 201 along an edge 221 of the cutout 202, according to various embodiments. In embodiments, the PCB 201 may be an example of the PCB 101, the cutout 202 may be an example of the cutout 102, and the EMI shield 203 may be an example of the EMI shield 103, shown in FIG. 1.

In embodiments, the electronic apparatus 200 may include the PCB 201. The PCB 201 may include multiple layers, e.g., a ground layer, a dielectric layer, and other conductive layers and dielectric layers, which may be the same as the PCB 201 in top view. The PCB 201 may include the cutout 202 that may be through the multiple layers of the PCB 201. The cutout 202 may be of a circular shape, a square, a rectangular shape, an elliptical shape, or a polygon shape.

The EMI shield 203 may be mounted to the bottom side of the PCB 201 along an edge 221 of the cutout 202. The EMI shield 203 may be coupled to the ground layer of the PCB 201 through a via or an ohmic contact 217. The EMI shield 203 may be coupled to the ground layer of the PCB 201 through the ohmic contact 217 by way of a via. In embodiments, the ohmic contact 217 may be located at a corner around the cutout 202, and the ohmic contact 217 may be formed by a conductive paste or epoxy. The EMI shield 203 may be flat, and may include copper, aluminum, copper alloy, nickel, silver, or an EMI shielding plastic compound material. The EMI shield 203 may be surface mounted to the bottom side of the PCB 201, similar to the EMI shield 103 shown in FIG. 1. In some other embodiments, the EMI shield 203 may be flush mounted to the bottom side of the PCB 201, similar to an EMI shield 303 as shown in FIG. 3.

In embodiments, a circuit package, not shown, may be affixed to the PCB 201 at the top side of the PCB 201. A part of a component of the circuit package may be placed within the cutout 202 of the PCB 201. In addition, the circuit package may include a package substrate, a LSC, a VR, a processor, memory chips, active devices, or passive devices such as capacitors, resistors, which are not shown.

FIG. 3 illustrates a cross-section view of another example electronic apparatus 300 including a PCB 301 having a cutout 302, and an EMI shield 303 mounted to a bottom side 312 of the PCB 301 along an edge of the cutout 302, according to various embodiments. In embodiments, The PCB 301 may be an example of the PCB 101, the cutout 302 may be an example of the cutout 102, and the EMI shield 303 may be an example of the EMI shield 103, shown in FIG. 1.

In embodiments, the electronic apparatus 300 may include the PCB 301 with a top side 314 and the bottom side 312 opposite to the top side 314. The PCB 301 may include multiple layers, e.g., a ground layer 311, a dielectric layer 313, and other conductive layers and dielectric layers. The PCB 301 may include the cutout 302 that is through the multiple layers of the PCB 301.

In embodiments, a circuit package 305 may be affixed to the PCB 301 on the top side 314 of the PCB 301 through connectors 307. The circuit package 305 may include a package substrate 351, where a component 357, a component 353, and a component 359 may be placed on different sides of the package substrate 351. In some embodiments, the component 357 may be a LSC, the component 353 may be a VR, and the component 359 may be a processor. A part of a component 357, e.g., a LSC, may be placed within the cutout 302 of the PCB 301. In some embodiments, the component 357, the component 353, and the component 359 may be any component other than a LSC, a VR, and/or a processor. Other components, such as active devices, or passive devices such as capacitors, resistors, may be included in the circuit package 305, not shown. Additionally and alternatively, fewer components may be included in the circuit package 305, without the component 357, the component 353, the component 359, or more.

In embodiments, the EMI shield 303 may be mounted to the bottom side 312 of the PCB 301 along an edge of the cutout 302. The EMI shield 303 may be flat, and may include copper, aluminum, copper alloy, nickel, silver, or an EMI shielding plastic compound material. The EMI shield 303 may be flush mounted to the bottom side of the PCB 301. In some embodiments, the EMI shield 303 may be embedded into a corner of the PCB 301 around the cutout 302 so that a surface 331 of the EMI shield 303 may be at a same level as the bottom side 312 of the PCB 301. In this way, the height of the electronic apparatus 300 is reduced further as compared to the electronic apparatus 100 shown in FIG. 1, where the EMI shield 103 may be surface mounted to the bottom side of the PCB 101. Furthermore, the EMI shield 303 may be coupled to the ground layer 311 through a via 315 and an ohmic contact 317. The ohmic contact 317 may be located above the EMI shield 303 and may be formed by a conductive paste or epoxy.

Figure 4:
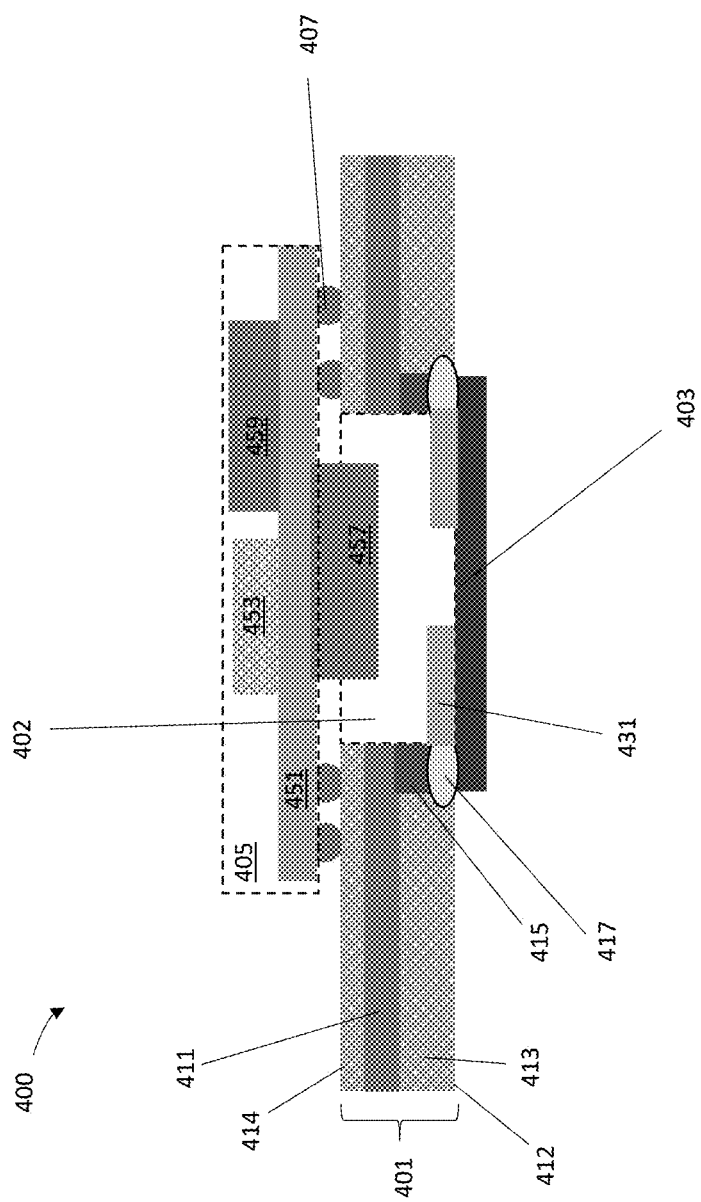
FIG. 4 illustrates a cross-section view of another example electronic apparatus including a PCB having a cutout, and an EMI shield mounted to a bottom side of the PCB along an edge of the cutout, according to various embodiments.

FIG. 4 illustrates a cross-section view of another example electronic apparatus 400 including a PCB 401 having a cutout 402, and an EMI shield 403 mounted to a bottom side 412 of the PCB 401 along an edge of the cutout 402, according to various embodiments. In embodiments, The PCB 401 may be an example of the PCB 101, the cutout 402 may be an example of the cutout 102, and the EMI shield 403 may be an example of the EMI shield 103, shown in FIG. 1.

In embodiments, the electronic apparatus 400 may include the PCB 401 with a top side 414 and the bottom side 412 opposite to the top side 414. The PCB 401 may include multiple layers, e.g., a ground layer 411, a dielectric layer 413, and other conductive layers and dielectric layers. The PCB 401 may include the cutout 402 that is through the multiple layers of the PCB 401.

In embodiments, a circuit package 405 may be affixed to the PCB 401 on the top side 414 of the PCB 401 through connectors 407. The circuit package 405 may include a package substrate 451, where a component 457, a component 453, and a component 459 may be placed on different sides of the package substrate 451. In some embodiments, the component 457 may be a LSC, the component 453 may be a VR, and the component 459 may be a processor. A part of a component 457, e.g., a LSC, may be placed within the cutout 402 of the PCB 401. In some embodiments, the component 457, the component 453, and the component 459 may be any component other than a LSC, a VR, and/or a processor. Other components, such as active devices, or passive devices such as capacitors, resistors, may be included in the circuit package 405, not shown. Additionally and alternatively, fewer components may be included in the circuit package 405, without the component 457, the component 453, the component 459, or more.

In embodiments, the EMI shield 403 may be mounted to the bottom side 412 of the PCB 401 along an edge of the cutout 402. The EMI shield 403 may be flat, and may include copper, aluminum, copper alloy, nickel, silver, or an EMI shielding plastic compound material. The EMI shield 403 may be surface mounted to the bottom side of the PCB 401, similar to the EMI shield 103 surface mounted to the bottom side of the PCB 101 as shown in FIG. 1. In some other embodiments, the EMI shield 403 may be flush mounted to the bottom side of the PCB 401, similar to the EMI shield 303 flush mounted to the bottom side of the PCB 301 as shown in FIG. 3. Furthermore, the EMI shield 403 may be coupled to the ground layer 411 through a via 415 and an ohmic contact 417. The ohmic contact 417 may be located at a corner around the cutout 402, and may be formed by a conductive paste or epoxy.

In embodiments, a support layer 431 may be formed above the EMI shield 403 next to the ohmic contact 417 to provide support for the ohmic contact 417. The support layer 431 may include some dielectric material, or other conductive material, to block solder run-away when the ohmic contact 417 is formed. Hence, the support layer 431 may provide better support for the contact 417 with the EMI shield 403 and the via 415. Embodiments of the electronic apparatus 400 may have the EMI shield 403 surfaced mounted on the bottom side 412 of the PCB 401, with the support layer 431 on top of the EMI shield 403 and next to ohmic contact 417. In some embodiments, an electronic apparatus may have the EMI shield flush mounted on the bottom side of the PCB, as shown in FIG. 3, with a support layer on top of the EMI shield and next to ohmic contact.

Figure 5:
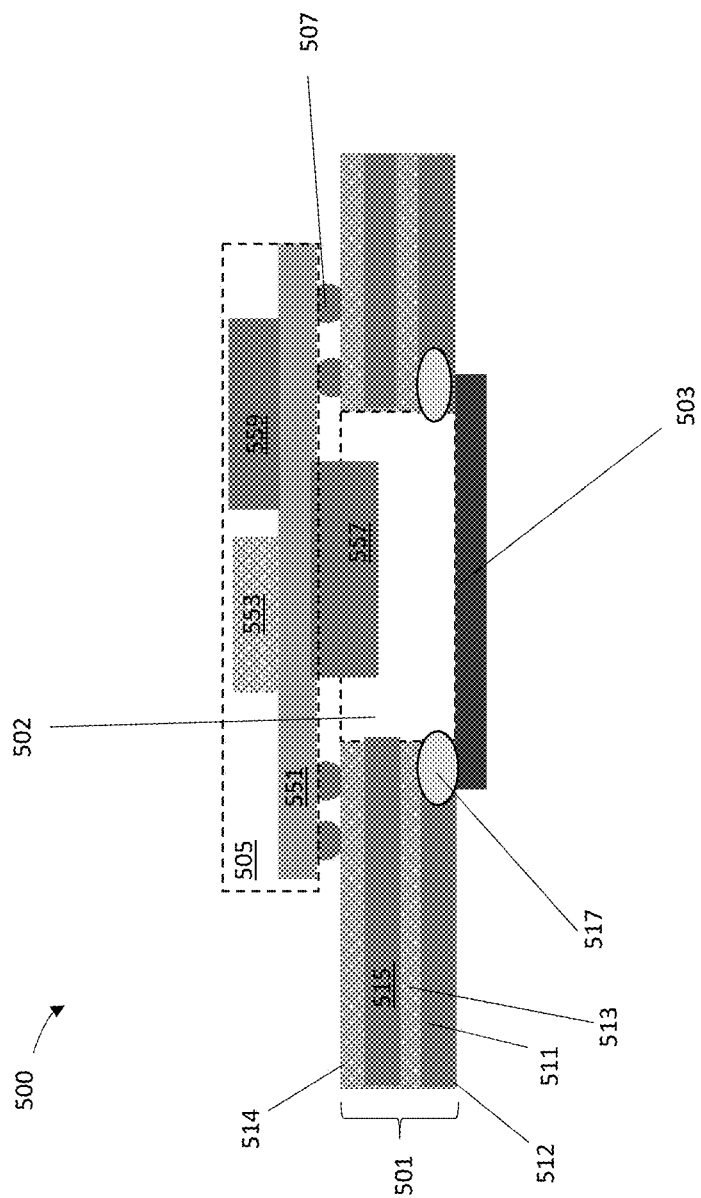
FIG. 5 illustrates a cross-section view of another example electronic apparatus including a PCB having a cutout, and an EMI shield mounted to a bottom side of the PCB along an edge of the cutout, according to various embodiments.

FIG. 5 illustrates a cross-section view of another example electronic apparatus 500 including a PCB 501 having a cutout 502, and an EMI shield 503 mounted to a bottom side 512 of the PCB 501 along an edge of the cutout 502, according to various embodiments. In embodiments, the PCB 501 may be an example of the PCB 101, the cutout 502 may be an example of the cutout 102, and the EMI shield 503 may be an example of the EMI shield 103, shown in FIG. 1.

In embodiments, the electronic apparatus 500 may include the PCB 501 with a top side 514 and the bottom side 512 opposite to the top side 514. The PCB 501 may include multiple layers, e.g., a ground layer 511, a dielectric layer 513, and other conductive layers and dielectric layers. For example, the PCB 501 may further include another metal layer 515, which may be a signal layer or a power layer. In embodiments, the ground layer 511 may be a bottom metal layer of the PCB 501 that is closest to the EMI shield 503, and the metal layer 515 may be above the ground laser 511. The metal layer 515 may include a conductive metal or an alloy of metal, such as aluminum, copper, and/or steel alloy, or other conductive metal. The PCB 501 may include the cutout 502 that is through the multiple layers of the PCB 501.

In embodiments, a circuit package 505 may be affixed to the PCB 501 on the top side 514 of the PCB 501 through connectors 507. The circuit package 505 may include a package substrate 551, where a component 557, a component 553, and a component 559 may be placed on different sides of the package substrate 551. In some embodiments, the component 557 may be a LSC, the component 553 may be a VR, and the component 559 may be a processor. A part of a component 557, e.g., a LSC, may be placed within the cutout 502 of the PCB 501. In some embodiments, the component 557, the component 553, and the component 559 may be any component other than a LSC, a VR, and/or a processor. Other components, such as active devices, or passive devices such as capacitors, resistors, may be included in the circuit package 505, not shown. Additionally and alternatively, fewer components may be included in the circuit package 505, without the component 557, the component 553, the component 559, or more.

In embodiments, the EMI shield 503 may be mounted to the bottom side 512 of the PCB 501 along an edge of the cutout 502. The EMI shield 503 may be flat, and may include copper, aluminum, copper alloy, nickel, silver, or an EMI shielding plastic compound material. The EMI shield 503 may be surface mounted to the bottom side of the PCB 501, similar to the EMI shield 103 surface mounted to the bottom side of the PCB 101 as shown in FIG. 1. In some other embodiments, the EMI shield 503 may be flush mounted to the bottom side of the PCB 501, similar to the EMI shield 303 flush mounted to the bottom side of the PCB 301 as shown in FIG. 3. Furthermore, the EMI shield 503 may be coupled to the ground layer 511 through an ohmic contact 517. The ohmic contact 517 may be located at a corner around the cutout 502, and may be formed by a conductive paste or epoxy. When the ground layer 511 may be a bottom metal layer of the PCB 501 that is closest to the EMI shield 503, there may be no via between the ground layer 511 and the EMI shield 503. In some embodiments, additional support layer, not shown, may be formed above the EMI shield 503 next to the ohmic contact 517 to provide support for the ohmic contact 517.

Figure 6:
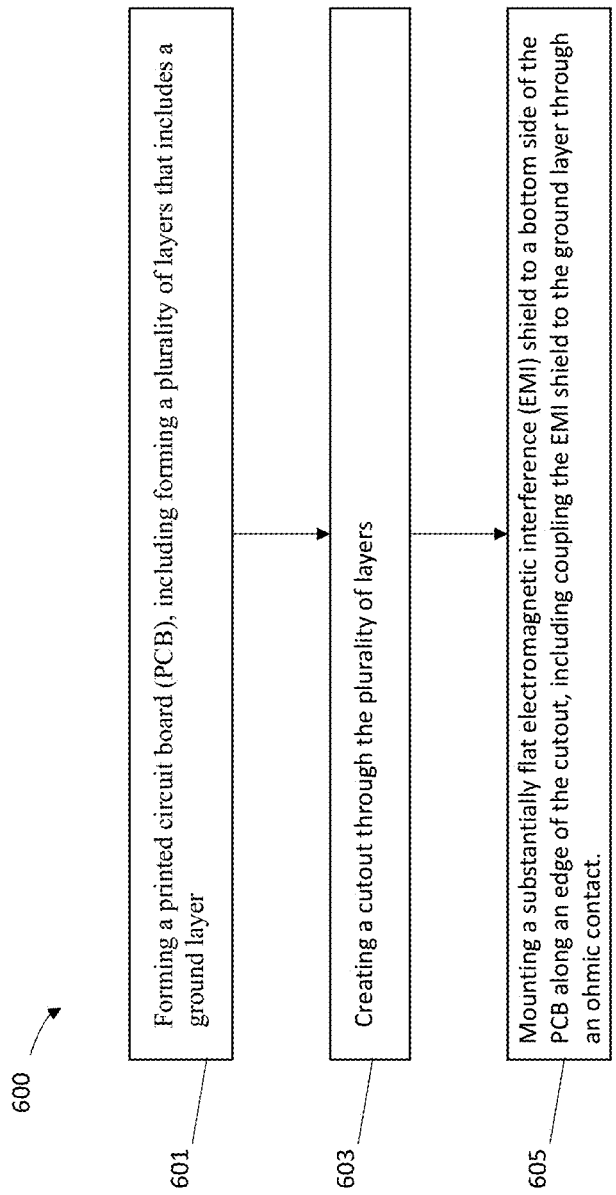
FIG. 6 illustrates a process for making an electronic apparatus, according to various embodiments.

FIG. 6 illustrates a process 600 for making an electronic apparatus, according to various embodiments. In embodiments, the process 600 may be a process performed to make the electronic apparatus 100 as shown in FIG. 1, the electronic apparatus 200 as shown in FIG. 2, the electronic apparatus 300 as shown in FIG. 3, the electronic apparatus 400 as shown in FIG. 4, or the electronic apparatus 500 as shown in FIG. 5.

The process 600 may start at an interaction 601. During the interaction 601, operations may be performed to form a PCB, including forming a plurality of layers that includes a ground layer. For example, at the interaction 601, the PCB 101 may be formed, which may include a plurality of layers that includes the ground layer 111.

During an interaction 603, operations may be performed to create a cutout through the plurality of layers. For example, at the interaction 603, the cutout 102 may be formed through the plurality of layers of the PCB 101.

During an interaction 605, operations may be performed to mount a substantially flat EMI shield to a bottom side of the PCB along an edge of the cutout, including coupling the EMI shield to the ground layer through an ohmic contact. For example, at the interaction 605, the EMI shield 103 may be mounted to a bottom side 112 of the PCB 101 along an edge of the cutout 102. The EMI shield 103 may be flat or substantially flat. The EMI shield 103 may be coupled to the ground layer 111 through the ohmic contact 117.

Figure 7:
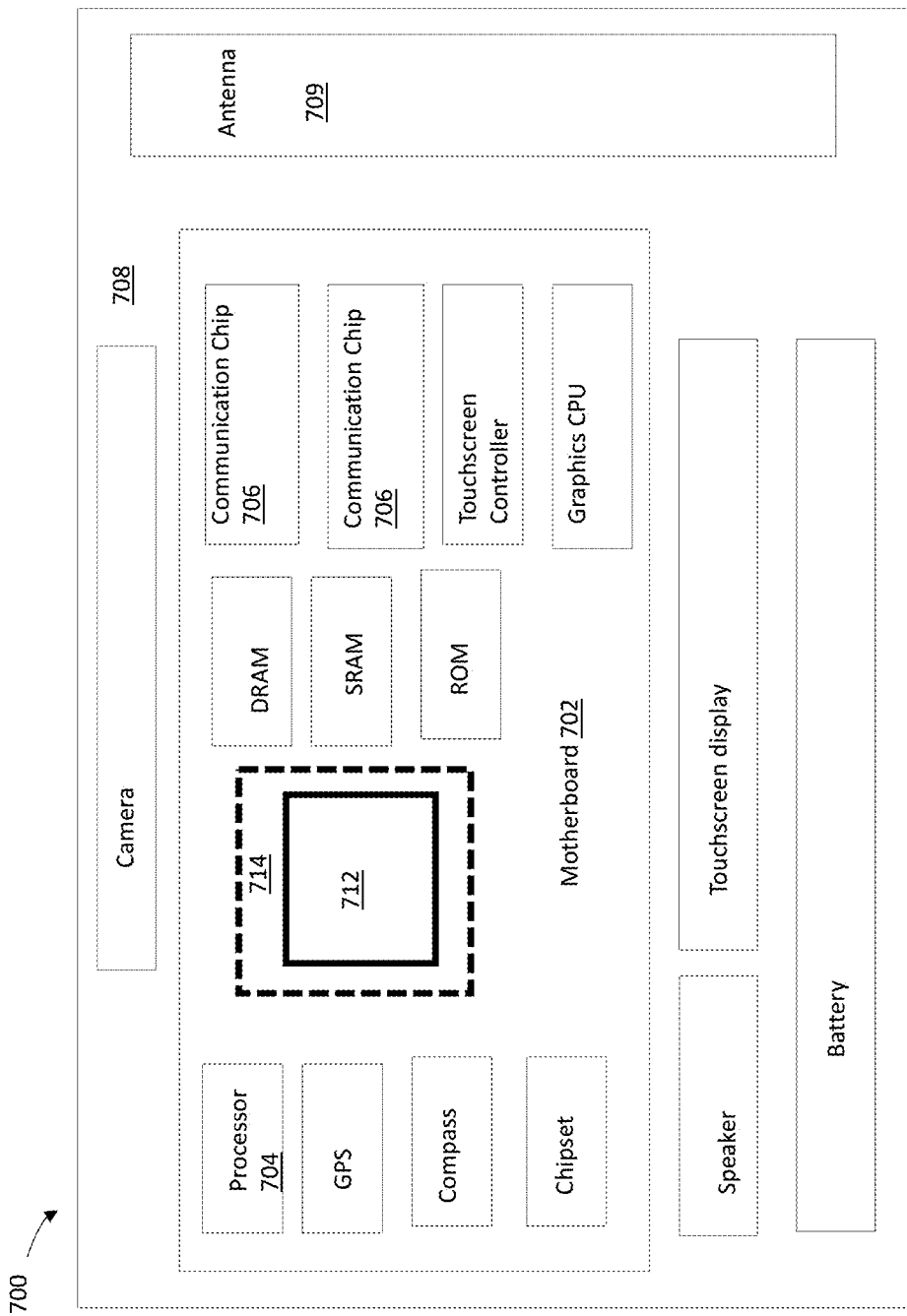
FIG. 7 illustrates an example computing device that may employ the apparatuses and/or methods described herein, according to various embodiments.

FIG. 7 illustrates an example computing device 700 that may employ the apparatuses and/or methods described herein (e.g., the computing device 700 assembled on a motherboard 702, which may be a PCB, with circuit packages), according to various embodiments. In embodiments, the motherboard 702 may include a cutout 712, and an EMI shield 714 mounted to a bottom side of the motherboard 702 along an edge of the cutout 712. In embodiments, the motherboard 702 may be an example of the PCB 101, the cutout 712 may be an example of the cutout 102, and the EMI shield 714 may be an example of the EMI shield 103, shown in FIG. 1.

Components of the computing device 700 may be housed in an enclosure (e.g., housing 708). The motherboard 702 may include a number of components, including but not limited to a processor 704 and at least one communication chip 706. The processor 704 may be physically and electrically coupled to the motherboard 702. In some implementations, at least one communication chip 706 may also be physically and electrically coupled to the motherboard 702. In further implementations, the communication chip 706 may be part of the processor 704. In addition, the computing device 700 may further include an antenna 709 outside the motherboard 702.

Depending on its applications, the computing device 700 may include other components that may or may not be physically and electrically coupled to the motherboard 702. These other components may include, but are not limited to, volatile memory (e.g., DRAM), static random access memory (SRAM), non-volatile memory (e.g., ROM), flash memory, a graphics central processing unit (CPU), a digital signal processor, a crypto processor, a chipset, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). These components may be included in circuit packages, e.g., the circuit package 105 as shown in FIG. 1. The components, such as the processor 704, the communication chip 706, DRAM, SRAM, ROM, GPS, may have different heights.

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, EV-DO, and others.

In various implementations, the computing device 700 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
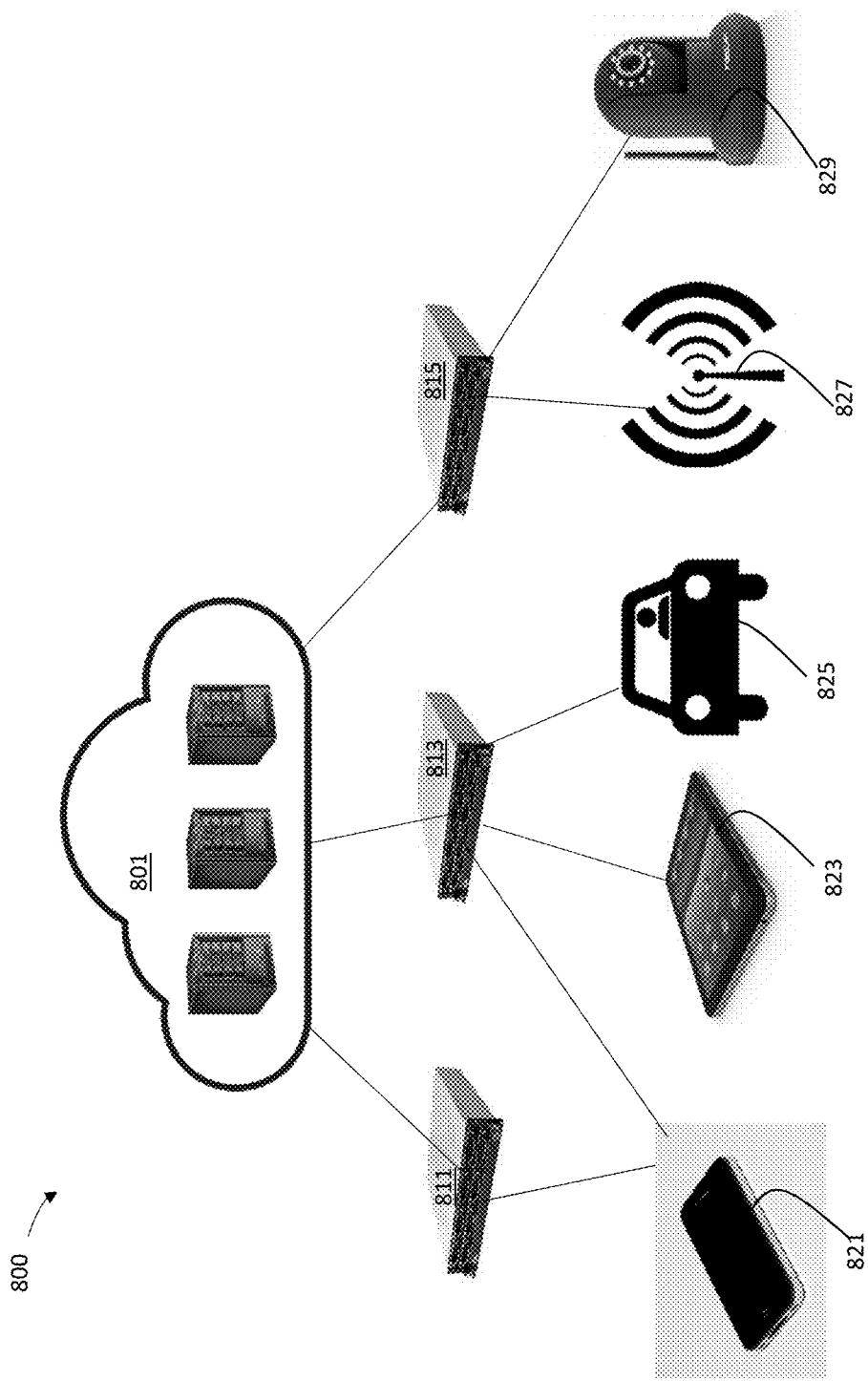
FIG. 8 illustrates an example computing environment having a number of client devices, or a number of edge devices (traditional or augmented with edge processing capabilities), incorporated with the teachings of the present disclosure, according to various embodiments.

FIG. 8 illustrates an example computing environment 800 having a number of client devices, e.g., a smartphone 821, a tablet 823, an onboard vehicle infotainment system 825, a wireless communication router 827, or a virtual personal assistant 829, or a number of edge devices, e.g., routers, switches or gateways 811-815 (traditional or augmented with edge processing capabilities), incorporated with the teachings of the present disclosure, according to various embodiments. In embodiments, the client devices 821-829, or the edge devices 811-815 may be the electronic apparatus 100 as shown in FIG. 1, the electronic apparatus 200 as shown in FIG. 2, the electronic apparatus 300 as shown in FIG. 3, the electronic apparatus 400 as shown in FIG. 4, the electronic apparatus 500 as shown in FIG. 5, or the computing device 700 as shown in FIG. 7.

In embodiments, a client device, e.g., one of client devices 821-829, may communicate with an edge device, e.g., one or edge devices 811-815, by various communication technology. Furthermore, an edge device, e.g., one of edge devices 811-815, may communicate with the cloud 801 having a number of remote cloud servers.

In embodiments, a client device, e.g., one of client devices 821-829, may collect various data. A client device may be a device that may not be continuously connected to a network or an edge device. An edge device, e.g., one of edge devices 811-815, may perform data processing at the edge of the network, near the source of the data. This reduces the communications bandwidth needed between a client device and the cloud, e.g., a central data center, by performing analytics and knowledge generation at or near the source of the data. An edge device may have full, uninterrupted access to the cloud 801 capable of processing and transmitting data quickly to the client device.

In embodiments, the client devices 821-829, and the edge devices 811-815, may be a part of wireless sensor network, a mobile data acquisition network, a cooperative distributed peer-to-peer ad hoc network, a local cloud/fog computing network, a grid/mesh computing network, a dew computing network, a mobile edge computing network, a cloudlet, a distributed data storage and retrieval network, an autonomic self-healing network, an augmented reality network, or other network.

In embodiments, the client devices 821-829, and the edge devices 811-815, may be a computing system. In addition to the depicted examples, the client devices 821-829 or the edge devices 811-815 may include, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, vehicle-embedded computer device, an Instrument Cluster (IC), head-up display (HUD) devices, onboard diagnostic (OBD) devices, dashtop mobile equipment (DME), mobile data terminals (MDTs), electronic engine management system (EEMS), electronic/engine control units (ECUs), electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle. Each of these devices may include one or more electronic components have the EMI shielding teaching of the disclosure, earlier described with references to FIGS. 1-6.

Thus various example embodiments of the present disclosure have been described including, but are not limited to:

Example 1 may include an electronic apparatus, comprising: a printed circuit board (PCB), wherein the PCB has a plurality of layers including a ground layer, and the PCB includes a cutout through the plurality of layers; and an electromagnetic interference (EMI) shield mounted to a bottom side of the PCB along an edge of the cutout, wherein the EMI shield is coupled to the ground layer through an ohmic contact, and the EMI shield is flat.

Example 2 may include the electronic apparatus of example 1 and/or some other examples herein, further comprising: a support layer within the cutout above the EMI shield and next to the ohmic contact to provide support for the ohmic contact.

Example 3 may include the electronic apparatus of any one of examples 1-2 and/or some other examples herein, wherein the ohmic contact is located at a corner around the cutout, and the ohmic contact is formed by a conductive paste or epoxy.

Example 4 may include the electronic apparatus of any one of examples 1-2 and/or some other examples herein, wherein the ground layer includes a conductive metal or an alloy of metal.

Example 5 may include the electronic apparatus of any one of examples 1-2 and/or some other examples herein, wherein the ground layer is a bottom metal layer of the PCB that is closest to the EMI shield.

Example 6 may include the electronic apparatus of any one of examples 1-2 and/or some other examples herein, wherein the PCB further includes a signal layer or a power layer above the ground layer.

Example 7 may include the electronic apparatus of any one of examples 1-2 and/or some other examples herein, wherein the EMI shield includes copper, aluminum, copper alloy, nickel, silver, or an EMI shielding plastic compound material.

Example 8 may include the electronic apparatus of any one of examples 1-2 and/or some other examples herein, wherein the EMI shield is flush mounted or surface mounted to the bottom side of the PCB.

Example 9 may include the electronic apparatus of any one of examples 1-2 and/or some other examples herein, wherein the cutout is of a circular shape, a square, a rectangular shape, an elliptical shape, or a polygon shape.

Example 10 may include the electronic apparatus of any one of examples 1-2 and/or some other examples herein, further comprising: a circuit package affixed to the PCB on a top side of the PCB, wherein the top side of the PCB is opposite to the bottom side of the PCB, a part of a component of the circuit package is placed within the cutout of the PCB.

Example 11 may include the electronic apparatus of example 10 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 12 may include the electronic apparatus of example 10 and/or some other examples herein, wherein the electronic apparatus comprises a wearable device, a smartphone, or an Internet of Things (IOT) device, and the circuit package includes an integrated voltage regulator (IVR) on a system-on-chip (SoC).

Example 13 may include an electronic apparatus, comprising: a printed circuit board (PCB), wherein the PCB has a plurality of layers including a ground layer, and the PCB includes a cutout through the plurality of layers; an electromagnetic interference (EMI) shield mounted to a bottom side of the PCB along an edge of the cutout, wherein the EMI shield is coupled to the ground layer through an ohmic contact, and the EMI shield is flat; and a circuit package affixed to the PCB on a top side of the PCB, wherein the top side of the PCB is opposite to the bottom side of the PCB, a part of a component of the circuit package is placed within the cutout of the PCB.

Example 14 may include the electronic apparatus of example 13 and/or some other examples herein, further comprising: a support layer within the cutout above the EMI shield and next to the ohmic contact to provide support for the ohmic contact.

Example 15 may include the electronic apparatus of any one of examples 13-14 and/or some other examples herein, wherein the ohmic contact is located at a corner around the cutout, and the ohmic contact is formed by a conductive paste or epoxy.

Example 16 may include the electronic apparatus of any one of examples 13-14 and/or some other examples herein, wherein the EMI shield includes copper, aluminum, copper alloy, nickel, silver, or an EMI shielding plastic compound material.

Example 17 may include the electronic apparatus of any one of examples 13-14 and/or some other examples herein, wherein the EMI shield is flush mounted or surface mounted to the bottom side of the PCB.

Example 18 may include a computing device, comprising: a circuit package to include a processor; a display coupled to the processor; a printed circuit board (PCB), wherein the circuit package is affixed to the PCB on a top side of the PCB, the PCB has a plurality of layers including a ground layer, and the PCB includes a cutout through the plurality of layers; and an electromagnetic interference (EMI) shield mounted to a bottom side of the PCB along an edge of the cutout, wherein the top side of the PCB is opposite to the bottom side of the PCB the EMI shield is coupled to the ground layer through an ohmic contact, and the EMI shield is flat.

Example 19 may include the computer device of example 18 and/or some other examples herein, further comprising: a support layer within the cutout above the EMI shield and next to the ohmic contact to provide support for the ohmic contact.

Example 20 may include the computer device of any one of examples 18-19 and/or some other examples herein, wherein the ohmic contact is located at a corner around the cutout, and the ohmic contact is formed by a conductive paste or epoxy.

Example 21 may include the computer device of any one of examples 18-19 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 22 may include the computer device of any one of examples 18-19 and/or some other examples herein, wherein the EMI shield includes copper, aluminum, copper alloy, nickel, silver, or an EMI shielding plastic compound material.

Example 23 may include the computer device of any one of examples 18-19 and/or some other examples herein, wherein the EMI shield is flush mounted or surface mounted to the bottom side of the PCB.

Example 24 may include the computer device of any one of examples 18-19 and/or some other examples herein, wherein the cutout is of a circular shape, a square, a rectangular shape, an elliptical shape, or a polygon shape.

Example 25 may include the computer device of any one of examples 18-19 and/or some other examples herein, wherein the computing device is a wearable device, a smartphone, or an Internet of Things (IOT) device, and the circuit package includes an integrated voltage regulator (IVR) on a system-on-chip (SoC).

Example 26 may include a method for forming an electronic apparatus, comprising: forming a printed circuit board (PCB), including forming a plurality of layers that includes a ground layer; creating a cutout through the plurality of layers; and mounting a substantially flat electromagnetic interference (EMI) shield to a bottom side of the PCB along an edge of the cutout, including coupling the EMI shield to the ground layer through an ohmic contact.

Example 27 may include the method of example 26 and/or some other examples herein, further comprising: forming a support layer within the cutout above the EMI shield and next to the ohmic contact to provide support for the ohmic contact.

Example 28 may include the method of any one of examples 26-27 and/or some other examples herein, wherein the ohmic contact is located at a corner around the cutout, and the ohmic contact is formed by a conductive paste or epoxy.

Example 29 may include the method of any one of examples 26-27 and/or some other examples herein, wherein the ground layer includes a conductive metal or an alloy of metal.

Example 30 may include the method of any one of examples 26-27 and/or some other examples herein, wherein the ground layer is a bottom metal layer of the PCB that is closest to the EMI shield.

Example 31 may include the method of any one of examples 26-27 and/or some other examples herein, wherein the PCB further includes a signal layer or a power layer above the ground layer.

Example 32 may include the method of any one of examples 26-27 and/or some other examples herein, wherein the EMI shield includes copper, aluminum, copper alloy, nickel, silver, or an EMI shielding plastic compound material.

Example 33 may include the method of any one of examples 26-27 and/or some other examples herein, wherein the EMI shield is flush mounted or surface mounted to the bottom side of the PCB.

Example 34 may include the method of any one of examples 26-27 and/or some other examples herein, wherein the cutout is of a circular shape, a square, a rectangular shape, an elliptical shape, or a polygon shape.

Example 35 may include the method of any one of examples 26-27 and/or some other examples herein, further comprising: affixing a circuit package to the PCB on a top side of the PCB, wherein the top side of the PCB is opposite to the bottom side of the PCB, a part of a component of the circuit package is placed within the cutout of the PCB.

Example 36 may include the method of example 35 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 37 may include the method of example 35 and/or some other examples herein, wherein the electronic apparatus comprises a wearable device, a smartphone, or an Internet of Things (IOT) device, and the circuit package includes an integrated voltage regulator (IVR) on a system-on-chip (SoC).

Example 38 may include one or more computer-readable media having instructions for a computer device to form an electronic apparatus, upon execution of the instructions by one or more processors, to perform the method of any one of examples 26-37.

Example 39 may include an apparatus for forming an electronic apparatus, comprising: means for forming a printed circuit board (PCB), including forming a plurality of layers that includes a ground layer; means for creating a cutout through the plurality of layers; and means for mounting a substantially flat electromagnetic interference (EMI) shield to a bottom side of the PCB along an edge of the cutout, including coupling the EMI shield to the ground layer through an ohmic contact.

Example 40 may include the apparatus of example 39 and/or some other examples herein, further comprising: means for forming a support layer within the cutout above the EMI shield and next to the ohmic contact to provide support for the ohmic contact.

Example 41 may include the apparatus of any one of examples 39-40 and/or some other examples herein, wherein the ohmic contact is located at a corner around the cutout, and the ohmic contact is formed by a conductive paste or epoxy.

Example 42 may include the apparatus of any one of examples 39-40 and/or some other examples herein, wherein the ground layer includes a conductive metal or an alloy of metal.

Example 43 may include the apparatus of any one of examples 39-40 and/or some other examples herein, wherein the ground layer is a bottom metal layer of the PCB that is closest to the EMI shield.

Example 44 may include the apparatus of any one of examples 39-40 and/or some other examples herein, wherein the PCB further includes a signal layer or a power layer above the ground layer.

Example 45 may include the apparatus of any one of examples 39-40 and/or some other examples herein, wherein the EMI shield includes copper, aluminum, copper alloy, nickel, silver, or an EMI shielding plastic compound material.

Example 46 may include the apparatus of any one of examples 39-40 and/or some other examples herein, wherein the EMI shield is flush mounted or surface mounted to the bottom side of the PCB.

Example 47 may include the apparatus of any one of examples 39-40 and/or some other examples herein, wherein the cutout is of a circular shape, a square, a rectangular shape, an elliptical shape, or a polygon shape.

Example 48 may include the apparatus of any one of examples 39-40 and/or some other examples herein, further comprising: means for affixing a circuit package to the PCB on a top side of the PCB, wherein the top side of the PCB is opposite to the bottom side of the PCB, a part of a component of the circuit package is placed within the cutout of the PCB.

Example 49 may include the apparatus of example 48 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 50 may include the apparatus of example 48 and/or some other examples herein, wherein the electronic apparatus comprises a wearable device, a smartphone, or an Internet of Things (IOT) device, and the circuit package includes an integrated voltage regulator (IVR) on a system-on-chip (SoC).

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. An electronic apparatus, comprising:
a printed circuit board (PCB), wherein the PCB has a plurality of layers including a ground layer, and the PCB includes a cutout through the plurality of layers; and
an electromagnetic interference (EMI) shield mounted to a bottom surface of the PCB covering the cutout, wherein the EMI shield is in contact with a plurality of edges of the cutout, with a surface area larger than a surface area of the cutout, and wherein the EMI shield is coupled to the ground layer through an ohmic contact and a via, the ohmic contact is located at a corner around the cutout, and the via is along an edge of the cutout and between the ground layer and the ohmic contact, and the EMI shield is flat.

2. The electronic apparatus of claim 1, further comprising:
a support layer within the cutout above the EMI shield and next to the ohmic contact to provide support for the ohmic contact.

3. The electronic apparatus of claim 1, wherein the ohmic contact is located at a corner around the cutout, and the ohmic contact is formed by a conductive paste or epoxy.

4. The electronic apparatus of claim 1, wherein the ground layer includes a conductive metal or an alloy of metal.

5. The electronic apparatus of claim 1, wherein the ground layer is a bottom metal layer of the PCB that is closest to the EMI shield.

6. The electronic apparatus of claim 1, wherein the PCB further includes a signal layer or a power layer above the ground layer.

7. The electronic apparatus of claim 1, wherein the EMI shield includes copper, aluminum, copper alloy, nickel, silver, or an EMI shielding plastic compound material.

8. The electronic apparatus of claim 1, wherein the EMI shield is flush mounted or surface mounted to a bottom side of the PCB, and wherein the EMI shield is at a same level as the bottom side of the PCB.

9. The electronic apparatus of claim 1, wherein the cutout is of a circular shape, a square, a rectangular shape, an elliptical shape, or a polygon shape.

10. The electronic apparatus of claim 1, further comprising:
a circuit package affixed to the PCB on a top side of the PCB, wherein the top side of the PCB is opposite to a bottom side of the PCB, a part of a component of the circuit package is placed within the cutout of the PCB.

11. The electronic apparatus of claim 10, wherein the circuit package comprises one of: a chip scale package (CSP), a wafer-level package (WLP), a quad-flat no-leads (QFN) package, a dual-flat no-leads (DFN) package, or a package with overmold mounted on the PCB.

12. The electronic apparatus of claim 10, wherein the electronic apparatus comprises a wearable device, a smartphone, or an Internet of Things (IOT) device, and the circuit package includes an integrated voltage regulator (IVR) on a system-on-chip (SoC).

13. An electronic apparatus, comprising:
a printed circuit board (PCB), wherein the PCB has a plurality of layers including a ground layer, and the PCB includes a cutout through the plurality of layers;
an electromagnetic interference (EMI) shield mounted to a bottom surface of the PCB covering the cutout, wherein the EMI shield is in contact with a plurality of edges of the cutout, with a surface area larger than a surface area of the cutout, and wherein the EMI shield is coupled to the ground layer through an ohmic contact and a via, the ohmic contact is located at a corner around the cutout, and the via is along an edge of the cutout and between the ground layer and the ohmic contact, and the EMI shield is flat; and
a circuit package affixed to the PCB on a top side of the PCB, wherein the top side of the PCB is opposite to the bottom surface of the PCB, a part of a component of the circuit package is placed within the cutout of the PCB.

14. The electronic apparatus of claim 13, further comprising:
a support layer within the cutout above the EMI shield and next to the ohmic contact to provide support for the ohmic contact.

15. The electronic apparatus of claim 13, wherein the ohmic contact is located at a corner around the cutout, and the ohmic contact is formed by a conductive paste or epoxy.

16. The electronic apparatus of claim 13, wherein the EMI shield includes copper, aluminum, copper alloy, nickel, silver, or an EMI shielding plastic compound material.

17. The electronic apparatus of claim 13, wherein the EMI shield is flush mounted or surface mounted to a bottom side of the PCB, and wherein the EMI shield is at a same level as the bottom side of the PCB.

18. A computing device, comprising:
a circuit package to include a processor;
a display coupled to the processor;
a printed circuit board (PCB), wherein the circuit package is affixed to the PCB on a top side of the PCB, the PCB has a plurality of layers including a ground layer, and the PCB includes a cutout through the plurality of layers; and
an electromagnetic interference (EMI) shield mounted to a bottom surface of the PCB covering the cutout, wherein the EMI shield is in contact with a plurality of edges of the cutout, with a surface area larger than a surface area of the cutout, and wherein the top side of the PCB is opposite to the bottom surface of the PCB, the EMI shield is coupled to the ground layer through an ohmic contact and a via, the ohmic contact is located at a corner around the cutout, and the via is along an edge of the cutout and between the ground layer and the ohmic contact, and the EMI shield is flat.

19. The computing device of claim 18, further comprising:
a support layer within the cutout above the EMI shield and next to the ohmic contact to provide support for the ohmic contact.

20. The computing device of claim 18, wherein the ohmic contact is located at a corner around the cutout, and the ohmic contact is formed by a conductive paste or epoxy.

21. The computing device of claim 18, wherein the circuit package comprises one of: a chip scale package (CSP), a wafer-level package (WLP), a quad-flat no-leads (QFN) package, a dual-flat no-leads (DFN) package, or a package with overmold mounted on the PCB.

22. The computing device of claim 18, wherein the EMI shield includes copper, aluminum, copper alloy, nickel, silver, or an EMI shielding plastic compound material.

23. The computing device of claim 18, wherein the EMI shield is flush mounted or surface mounted to a bottom side of the PCB, and wherein the EMI shield is at a same level as the bottom side of the PCB.

24. The computing device of claim 18, wherein the cutout is of a circular shape, a square, a rectangular shape, an elliptical shape, or a polygon shape.

25. The computing device of claim 18, wherein the computing device is a wearable device, a smartphone, or an Internet of Things (IOT) device, and the circuit package includes an integrated voltage regulator (IVR) on a system-on-chip (SoC).

* * * * *